US012695073B2

(12) United States Patent
Newton et al.

(10) Patent No.: US 12,695,073 B2
(45) Date of Patent: Jul. 28, 2026

(54) METHOD OF ETCHING OR DEPOSITING A THIN FILM

(71) Applicant: Oxford Instruments Nanotechnology Tools Limited, High Wycombe (GB)

(72) Inventors: Andrew Newton, Abingdon (GB); Sungjin Cho, Abingdon (GB); Matthew Loveday, Abingdon (GB); Andrew Goodyear, Abingdon (GB)

(73) Assignee: OXFORD INSTRUMENTS NANOTECHNOLOGY TOOLS LIMITED, High Wycombe (GB)

( * ) Notice: Subject to any disclaimer, the term of this patent is extended or adjusted under 35 U.S.C. 154(b) by 122 days.

(21) Appl. No.: 18/576,486

(22) PCT Filed: Jul. 6, 2022

(86) PCT No.: PCT/GB2022/051740
§ 371 (c)(1),
(2) Date: Jan. 4, 2024

(87) PCT Pub. No.: WO2023/281259
PCT Pub. Date: Jan. 12, 2023

(65) Prior Publication Data
US 2025/0079141 A1      Mar. 6, 2025

(30) Foreign Application Priority Data
Jul. 6, 2021    (GB) ..................................... 2109722

(51) Int. Cl.
*H01J 37/32* (2006.01)
*H10P 74/00* (2026.01)
(52) U.S. Cl.
CPC ........ *H01J 37/3299* (2013.01); *H10P 74/238* (2026.01); *H01J 2237/334* (2013.01)

(58) Field of Classification Search
None
See application file for complete search history.

(56) References Cited

U.S. PATENT DOCUMENTS 5,405,488 A * 4/1995 Dimitrelis ......... H01J 37/32935
216/60
6,541,388 B1 * 4/2003 Saito ................. H01J 37/32963
438/719

(Continued)

FOREIGN PATENT DOCUMENTS

EP        0768701 A1      4/1997
EP        3012855 A1      4/2016
(Continued)

OTHER PUBLICATIONS

International Search Report, mail date Sep. 16, 2022, 3 pages, received in corresponding PCT application No. PCT/GB2022/051740.

(Continued)

*Primary Examiner* — Binh X Tran
(74) *Attorney, Agent, or Firm* — Blank Rome LLP

(57) ABSTRACT

A method of plasma etching or plasma deposition of a target layer of material in or onto a sample comprising a further layer of material, the method comprising: during a process of plasma etching or plasma deposition of the target layer of material: directing light of a first wavelength at the sample; measuring the intensity of light of the first wavelength reflected by the sample; directing light of a second wavelength at the sample; and measuring the intensity of light of the second wavelength reflected by the sample; determining, based on the intensities of light reflected by the sample, an endpoint of the process of plasma etching or plasma deposition of the target layer of material; and ending the process (Continued)

of plasma etching or plasma deposition of the target layer of material based on the determined endpoint.

16 Claims, 6 Drawing Sheets

(56) References Cited

U.S. PATENT DOCUMENTS

| | | | |
|---|---|---|---|
| 6,855,567 | B1 | 2/2005 | Ni et al. |
| 2001/0010939 | A1 | 8/2001 | Yamazawa et al. |
| 2004/0087152 | A1* | 5/2004 | Lian ................... G01B 11/0683 |
| | | | 438/689 |
| 2005/0085090 | A1* | 4/2005 | Mui ................. H01L 21/32137 |
| | | | 257/E21.256 |
| 2007/0019206 | A1 | 1/2007 | Ohbuchi |
| 2014/0024143 | A1* | 1/2014 | Li ........................... H01L 22/26 |
| | | | 156/345.24 |
| 2016/0351405 | A1* | 12/2016 | Fukuchi ............ H01J 37/32009 |

FOREIGN PATENT DOCUMENTS

| | | |
|---|---|---|
| JP | 2002-541663 A1 | 12/2002 |
| JP | 2014-17359 A1 | 1/2014 |
| WO | 9508186 A1 | 3/1995 |
| WO | 2004006306 A2 | 1/2004 |
| WO | 2014058522 A1 | 4/2014 |

OTHER PUBLICATIONS

Japanese Office Action for Japanese Application No. 2024-500521, mailed Jan. 19, 2026, 8 pages.

* cited by examiner

Reflectance v wavelength of AlGaN measured for two Al contents

METHOD OF ETCHING OR DEPOSITING A THIN FILM

CROSS-REFERENCE TO RELATED APPLICATIONS

This application is a national stage filing of PCT Application No. PCT/GB/2022/051740, filed on Jul. 6, 2022, which claims the benefit of GB Application No. 2109722.5, filed Jul. 6, 2021, both of which are hereby incorporated by reference in their entirety.

FIELD OF INVENTION

The present invention relates to a method of etching or depositing a thin film, and in particular to a method of etching thin film layers to within a defined distance of an interface between dissimilar materials using plasma etching and in situ dual wavelength reflectometry.

BACKGROUND

When carrying out a dry etching process in which a partial etch is desired, it is advantageous to monitor the etching to ensure that the desired degree of etching is achieved. This is the case even for techniques such as atomic layer etching (ALE) that allow for a high degree of control of the etching process, as variability in how such processes are carried out can negatively affect these processes. For example, if the gas used to dope the surface of the material to be etched is not sufficiently pumped out from the etching chamber then residual gases will likely alter the etching process, or there may be variation in the initial thickness of the layer to be partially etched.

Endpoint detection techniques have been used widely to detect when an etch process reaches a material interface, but little has been developed for accurately etching short of the interface, leaving a defined residual thickness of the layer above the interface.

An example of such an endpoint detection technique that has been used previously involves monitoring the change in the reflectance of a sample during an etch process. As the layer to be etched will typically have different optical properties of the underlying material, the reflectance of the sample will change during the etch. By selecting a frequency at which either the layer to be etched or the underlying material exhibits a peak or trough in reflectance, the change in reflectance of the sample will increase or decrease during the etch, reaching a plateau once the layer to be etched has been completely removed. It follows that it is, in principle, possible to monitor the etch process and determine the endpoint of the etch process.

However, this technique is not suitable for accurately etching short of the interface between the layer to be etched and the underlying material in order to leave a predetermined residual thickness of the layer to be etched. Furthermore, there are practical limitations to monitoring the reflectance of a single wavelength that mean it is difficult to accurately determine when the etch process has reached the interface with the underlying material, which can lead to over- or under-etching.

Similar problems are faced when attempting to deposit a layer of material of a pre-determined thickness onto a substrate, for example during atomic layer deposition. Although the rate of deposition can be estimated, it would be preferable if the thickness of the deposited layer of material could be monitored during the deposition process.

Therefore, what is needed is a more accurate technique for etching or depositing of a layer of material in or onto a sample comprising at least one further layer of material.

SUMMARY OF INVENTION

According to a first aspect of the invention, a method is provided of plasma etching a target layer of material in a sample or plasma deposition of a target layer of material onto a sample, the sample comprising a further layer of material. The method comprises: during a process of plasma etching or plasma deposition of the target layer of material: directing light of a first wavelength at the sample; measuring the intensity of light of the first wavelength reflected by the sample; directing light of a second wavelength at the sample; and measuring the intensity of light of the second wavelength reflected by the sample; and determining, based on the intensities of light reflected by the sample, an endpoint of the process of plasma etching or plasma deposition of the target layer of material; and ending the process of plasma etching or plasma deposition of the target layer of material based on the determined endpoint.

The terms "target layer of material" and "target layer" are used throughout the specification to refer to the layer of material that is either etched or deposited. The sample from which the target layer of material is etched or onto which the target layer of material is deposited comprises a further layer, which is to say that it comprises at least one further layer in addition to the target layer. The "further layer" may be the layer directly beneath the target layer, or there may be one or more intermediate layers. The further layer will typically be of a different material to the target layer.

Therefore, throughout the specification the expression "target layer of material" should be taken as synonymous with "layer to be etched" in the case of an etch process and "layer to be deposited" in the case of a deposition process. The target layer is often the upper layer of material, but there may be further layers provided above this layer which are etched first—for example, in the case of a layer of AlGaN provided on a layer of GaN, a "cap" layer of GaN may be provided above the AlGaN layer. However, for ease of understanding, throughout the specification the expression "upper layer" always refers to the target layer.

A method carried according to embodiments of the first aspect of the invention allows for the thickness of a target layer of material in a sample to be accurately monitored during the plasma etching or deposition process, and thereby allows for the endpoint for the process of plasma etching or plasma deposition to be accurately determined. For clarity, by "endpoint of the process of plasma etching or plasma deposition" we are referring to the point at which the plasma etching or deposition process is ended. In the case of an plasma etching process, which is the preferred application of the first aspect of the invention, this can be when the target layer of material has been fully removed in at least one region of the sample, when the target layer of material has been partially etched in one region of the sample, or a combination of the two. Likewise, the plasma deposition process may be ended when a target layer of material has been deposited across the sample or when a target layer of material has been deposited in at least one region of the sample.

When applied to a plasma etching process, this method allows for plasmaetching with a precisely controlled residual thickness. Specifically, the method allows for the thickness to be controlled with an accuracy of ±0.5 nm and a reproducibility of ±0.2 nm. Both of these allow for a good yield when manufacturing devices with tightly grouped electrical characteristics, such as enhancement-mode (normally off) high electron mobility transistors (HEMT). In particular, when producing such devices it is important to minimise damage to the remaining residual layer, and this is possible in the embodiments of the first aspect of the invention.

These benefits are realised in part by monitoring the intensity of light reflected by the sample at two wavelengths, which makes it possible to overcome difficulties that would be present themselves if only one wavelength were monitored, such run-to-run variability in signal levels due to window clouding, wafer tilt, or stray reflections, among others.

This method is particularly beneficial when applied to an ALE process, as ALE running in a genuinely surface limited regime is highly uniform, and can compensate for the typical non-uniformity of plasma etching. The uniformity of thickness of the residual layer then approaches the non-uniformity inherent in the original epitaxially grown thin film, and combined with the precise monitoring of the change of thickness in the target layer of material in a sample allows for a highly uniform etch with a precisely controlled residual thickness. ALE is also advantageous as it operates close to the sputter threshold energy for the layer being etched, and is therefore suitable for minimising damage to the residual layer.

However, it should be noted that the embodiments of the first aspect of the invention could also use low bias conventional plasma etching or a combination of conventional plasma etching and ALE. For example, the method could use either timed etching or measurement to govern the transition between continuous plasma etching and ALE, and the endpoint method to govern the final residual thickness with minimal damage in that layer. The combined method has a higher throughput than just using atomic layer etching.

Likewise, the benefits of the first aspect of the invention are also achieved when applied to a plasma deposition process. In this case, the highly precise monitoring of the target layer of material of a sample, which in this case refers to the deposited layer of material, allows for a layer to be deposited having a precisely controlled thickness.

As is explained in greater detail below, the method of the first aspect of the invention exploits the phenomenon that the optical properties of a sample will vary as the thickness of the target layer changes, with the optical properties of the sample dominated by the optical properties of the target layer when the target layer is thicker and by the optical properties of the underlying material when the target layer is thinner or is absent. The reflectance is the optical property of most interest since the method involves measuring the intensity of light reflected from the surface of the sample.

In order to make full use of this effect, therefore, the first wavelength will typically be chosen at a peak or trough in the reflectance of the target layer. For preferable uses of the method, such as when the target layer is made of AlGaN, the first wavelength is in the range of 280 nm to 340 nm, and is more preferably in the range of 320 to 340 nm.

Likewise, the second wavelength will typically be at a peak or trough in the reflectance of the further layer of material, which may be the layer of material directly underlying the target layer, as described above. For preferable uses of the method, such as when the underlying material is made of GaN, the second wavelength is in the range of 340 nm to 390 nm, and is more preferably in the range of 360 nm to 370 nm.

That being said, it may prove advantageous to choose the first or second wavelength at a region of the reflectance spectrum of, respectively, the target layer or the underlying material without a peak or trough, thereby providing a reference signal with which to compare the intensity of light reflected at the other wavelength.

In preferable embodiments of the first aspect of the invention, determining the endpoint of the plasma etching or deposition process comprises determining the reflectance of the sample at the first and second wavelengths, typically by, for each wavelength, taking the ratio of the intensity of light of said wavelength reflected by the sample to the intensity of light of said wavelength directed at the sample.

The reflectance of the sample is readily measured during an etch or deposition process, and is therefore a particularly suitable property on which to base the determination of when to stop the plasma etching or deposition process, or of when to transition from conventional plasma etching or deposition to atomic layer etching or deposition.

In still more preferable embodiments determining the endpoint of the plasma etching or deposition process comprises taking a ratio of the reflectance of the sample at the first wavelength to the reflectance of at the sample at the second wavelength.

By taking the ratio of the two reflectance measurements it is possible to overcome difficulties that would be present if only one wavelength were monitored, such run-to-run variability in signal levels due to window clouding, wafer tilt, or stray reflections, among others.

Often, the determination of when to end the plasma etching or deposition process will be based on using the ratio of the two reflectance measurements to determine the thickness of the target layer, and ending the plasma etching or deposition process when the target layer has reached a desired thickness. However, the form of the ratio trend may not be a simple linear (or near linear) relationship throughout the plasma etching or deposition process, in which case the slope of the ratio trend from a part of the plasma etching or deposition process can be used to calculate an etching or deposition rate, and the point at which to end the plasma etching or deposition process calculated based on this etch or deposition rate in order to leave the desired residual thickness.

The departure from a simple linear relationship may be due to one or more of quantum size effects, optical band gaps shifts due to the proximity of the underlying material, and temperature or strain influences. As such, these effects may be included in a model of thin film thicknesses to determine the endpoint of the plasma etching or deposition process in order to improve the precision of the residual thickness of the target layer.

Another example of a non-linear change in the optical properties of a sample is the change in reflectance during ALE. As will be explained in greater detail below, ALE involves cycles of doping a surface of a sample with a monolayer of, for example, chlorine atoms and then etching away a single atomic layer of the sample. During the doping phase the reflectance is largely stable, with the reflectance changing during the etching phase. The change in reflectance of the sample can be used to determine an etch rate per cycle and the etch can then be stopped after an appropriate number of ALE cycles.

Taking the ratio between reflectance measurements to determine the endpoint of the plasma etching or deposition process, allows for consistency in the expected ratio at various points in the plasma etching or deposition process, thereby allowing for the value or slope of this ratio to be used to infer the progress of the plasma etching or deposition process. However, the determination of when to end the plasma etching or deposition process is often made based on observing when the ratio reaches a plateau, or when the slope of the ratio inverts. In such cases, it is not necessary to take the ratio of the reflectance measurements, and determining the endpoint of the plasma etching or deposition process may comprise taking a ratio of the two measured intensities. This still allows for many of the advantages of the preferred embodiments in which the ratio of reflectance measurements is used to determine an endpoint of the plasma etching, but is often more straightforward.

The process described above may be applied to the further layers provided above the target layer to determine when to begin plasma etching the target layer of material—in the case of a cap layer of GaN provided on an AlGaN layer, this would be when to begin etching the AlGaN layer. In such cases, a turning point or other recognisable feature in the light intensity or reflectance measurements can be used to determine the start of etching the target layer using a dual wavelength reflectometer. As the first and second wavelengths are ideally chosen specifically for each layer stack type or composition, the apparatus used to carry out the method of the first aspect preferably comprises a broadband light source or tuneable lasers to give maximum flexibility.

Typically, external light sources are used to produce light of the first and second wavelengths, in which case it is preferable if one or both of the first and second wavelengths do not correspond to characteristic wavelengths in the emission spectrum of a plasma used in the plasma etching or deposition process. This simplifies the process of distinguishing the light reflected by the sample from the light emitted by the plasma used in the plasma etching or deposition process.

However, one or both of the light of the first wavelength and the light of the second wavelength directed at the sample can be provided by a plasma used in the plasma etching or deposition process.

The method of the first aspect may comprise a calibration step of measuring the intensity of light of the first and second wavelengths reflected by the sample at the start of the plasma etching or deposition process. This allows reference values of the light intensity or reflectance measurements to be determined, which can be used to calibrate the apparatus used to perform the method. The calibration step may also be taken at any other identifiable point in the plasma etching or deposition process. For example, a plasma etching process may involve a transition between etching layers of different materials, such as in the example described above of a capping layer of material is removed from the top of a sample. This transition may be identifiable in the measurements of the intensity of the light of the first and second wavelengths reflected by the sample, meaning the measurements taken at this transition can be used to calibrate the method.

As well as being suitable for calibrating the apparatus used to perform the method, measurements made at the start of a plasma etching process can be used to determine the thickness of the target layer of the sample at the start of the plasma etching process, which can then be used to determine how long the plasma etching process should be carried out for. In the case that one or more further layers are provided on top of the target layer of material, this determination could be made once those layers have been removed.

The endpoint is typically used to end the process of plasma etching or plasma deposition of the target layer of material at a predetermined residual thickness, preferably of 10 nm or less. In preferable embodiments of the invention where a target layer of material is to be etched to a predetermined residual thickness, prior to the process of plasma etching the target layer of material, the method further comprises an earlier step of etching the target layer of material to a first residual thickness. In these embodiments, the predetermined residual thickness is a second residual thickness, smaller than the first residual thickness. For example, the first residual thickness could be 25 nm and the second residual thickness could be 10 nm. The first etching step does not need to have as precisely defined an endpoint as the second etching step, and as such does not need to be carried out in accordance with the embodiments of the first aspect. This multi-stage etching process is also advantageous when a relatively slow etching process such as ALE is to be used in the second etching stage. ALE is very precise and allows for damage to the target layer to be minimised, but it is also slower than conventional etching methods such as inductively coupled plasma (ICP) etching. The multi-stage process therefore allows for the majority of the etching to be carried out using a faster conventional plasma etching process with the final residual thickness being achieved using a more precise etching process such as ALE.

These embodiments are well suited to producing devices in which the target layer needs to be etched to a precisely defined residual thickness and also allows for the production time to be reduced, thereby improving the rate at which devices can be produced.

The plasma etching is typically carried out at a pressure of around 1 mTorr to 100 mTorr, while the plasma deposition is typically carried out at a pressure of around 10 mTorr to 3000 mTorr.

According to a second aspect of the invention, a plasma processing apparatus suitable for carrying out the method of any of the embodiments of the first aspect of the invention is provided, the apparatus comprising a plasma processing chamber; at least two optical emitters; at least two optical detectors; and at least one optical port for coupling the at least two optical emitters and the at least two optical detectors to the inside of the plasma processing chamber.

A typical processing apparatus comprises a gas delivery system to control the flows of gaseous reactants into the plasma processing chamber; a plasma source, which may form part of the plasma processing chamber; a support inside the plasma processing chamber for a sample to be processed; a pressure control means for maintaining the pressure in the plasma processing chamber within a desired range; and a control system. The support will typically be temperature controlled and will be electrically isolated from the walls of the plasma processing chamber, with an RF power source connected to the support to allow for an electric field to be generated. The pressure control means includes an automatic pressure control and a means of evacuating the plasma processing chamber to around 1 mTorr to 100 mTorr for etching or 10 mTorr to 3000 mTorr for deposition.

BRIEF DESCRIPTION OF FIGURES

The embodiments of the invention will now be described with reference to the figures, in which.

DETAILED DESCRIPTION

Figure 1:
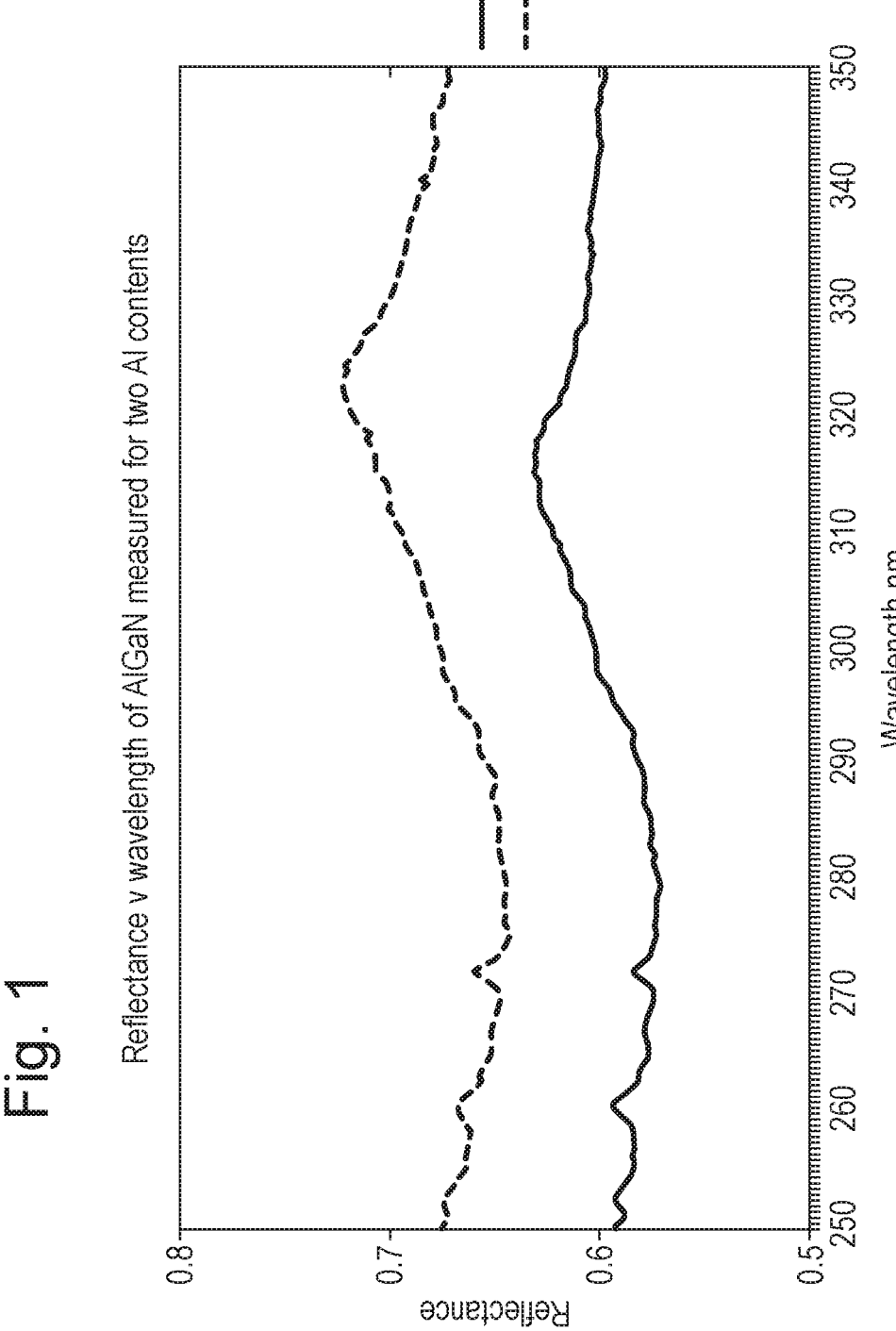
FIG. 1 shows the reflectance at the start of an AlGaN/GaN etch provided according to embodiments of the invention for two different compositions of AlGaN.

The following description focusses on the application of the invention to an etch process. However, it must be noted that these comments apply also to a deposition process.

The term sample should be taken as referring to a stack of one or more layers of different materials prior to an etch (or deposition) process that will be used when forming the end device. The sample may have undergone one or more processing stages prior to the etch (or deposition) process and may undergo one or more processing stages after the etch (or deposition) process.

It has been observed that when etching a sample comprising layers of different materials, the optical properties of the sample vary during the etch. For example, the reflectance of the upper surface of the sample will vary with the thickness of the upper layer of the sample, meaning that as the upper layer of the sample is removed, the reflectance of the sample will vary. The optical properties also vary due to interactions at the interface between the upper layer and the underlying material, especially at thickness of the upper layer of 10 nm or less.

This can be understood as a result of the different layers of the sample having different optical properties, with the optical properties of the upper layer of the sample being dominant at the start of the etch process and the optical properties of the underlying layer dominating the optical properties of the sample as a whole once the etch process is complete. As noted above, this is also a result of complex interactions that occur close to the interface between two layers of materials. For example, where the upper layer at least partially transmits light of a particular wavelength and the interface with at least one underlying layer at least partially reflects light of that wavelength, the intensity of light reflected by the sample as a whole will depend on the interference between reflections at the topmost surface and one or more of the buried interfaces. Other effects that can become dominant, especially when the upper layer has a thickness of 10 nm or less, include quantum size effects, optical band gaps shifts due to the proximity of the underlying material, and temperature or strain influences.

Monitoring the optical properties of a sample during an etch therefore allows for the progress of the etch to be determined and the etch process as a whole to be controlled. Of particular interest when monitoring the optical properties of a sample is the sample's reflectance, and one possible method of controlling the etch process involves monitoring the position of a characteristic peak or trough in the reflectance of the material of either the upper layer of the sample or of the underlying material. This allows the endpoint of the etch to be determined by observing when said peak or trough either disappears, in the case that a peak characteristic of the upper layer is monitored, or reaches a maxima, in the case that a peak characteristic of the underlying material is monitored.

However, a peak or trough characteristic to the upper layer could disappear, or become a double peak or double trough, at an intermediate point of the etch process and make it difficult to accurately determine the endpoint of the etch. Likewise, the same could occur when monitoring a peak or trough characteristic to the underlying material. Other difficulties may also present themselves that could negatively affect the accuracy of this method, such as run-to-run variability in signal levels due to, among other things, window clouding, wafer tilt, or stray reflections.

These issues can make it difficult to determine when the upper layer of a sample has been completely removed, and this is especially problematic when attempting to control an etch to leave a predetermined thickness of the upper layer.

In order to address the issues, the present invention monitors the optical properties of the sample at two different wavelengths.

FIG. 1 illustrates the reflectance of an AlGaN layer provided on a bulk GaN substrate. This graph shows the reflectance (on the y axis) of the upper substrate of two different samples as a function of wavelength (on the x axis), the upper line showing the reflectance properties of a 20% Al layer and the lower line showing the reflectance properties of a 23% Al layer. These lines each show a peak in reflectance in the 280 nm to 340 nm wavelength range. The position of this peak is dependent on the Al content of the layer, with a higher Al content giving a peak towards 280 nm and a lower Al content giving a peak towards 340 nm.

For example, in the case of an AlGaN layer the change in reflectance of the sample at the characteristic peak in the 280 nm to 340 nm wavelength range could be monitored and used to determine when the AlGaN layer has been completely or partially etched. However, as explained above, monitoring only this wavelength would make it difficult to accurately determine when to end the etch process.

Continuing with the example of an AlGaN layer provided on a bulk GaN substrate, while the AlGaN layer exhibits a peak in reflectance in the 280 nm to 340 nm wavelength range and a trough in reflectance at around 365 nm, the reflectance of the GaN substrate is approximately constant across the 280 to 370 nm range. By taking a ratio between the measured reflectance of a sample at the characteristic peak of the AlGaN layer and the measured reflectance of that sample at the characteristic trough of the AlGaN layer and identifying when that ratio passes through a pre-determined threshold, it is possible to determine the endpoint of the etch more accurately and with improved sensitivity.

Figure 2:
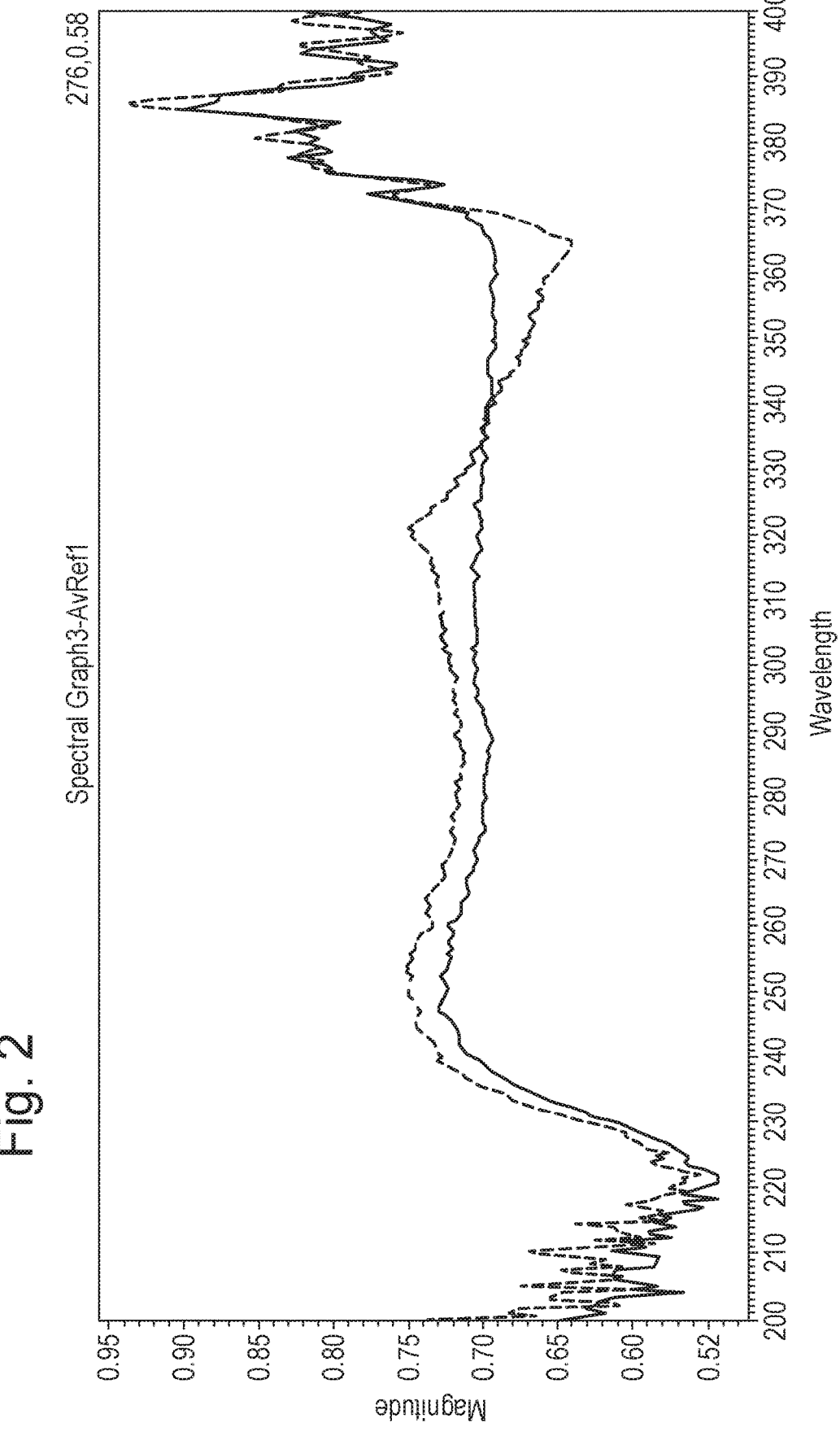
FIG. 2 shows the reflectance spectrum of a sample before and after an etch process provided according to embodiments of the invention.

The properties of an AlGaN layer compared with a GaN substrate are shown in FIG. 2. This figure shows the reflection spectra of a sample comprising a layer of AlGaN provided on a GaN substrate at the start and end of an etch process. The trace with a peak at around 325 nm and a trough at around 365 nm is shows the reflectance of the sample at the start of the etch process when the AlGaN layer is present while the other trace shows the reflectance of the sample at the end of the etch process when the AlGaN layer has been removed. As can be seen, there is a substantial change in the reflectance of the sample at these two wavelengths during the etch process.

There are a number of reasons for the improved accuracy and sensitivity of endpoint detection when monitoring two wavelengths, one of which is that by taking the ratio of the reflectance at the two wavelengths any errors due to poor calibration of the absolute reflectance are eliminated. Indeed, it is possible to determine this ratio simply by measuring the intensity of light reflected from the sample at the two wavelengths and taking the ratio of these two measurements, provided that the intensity of the incident light at the two wavelengths is constant throughout the etch process.

Another reason for the improvements provided by this method is that it takes advantage of the fact that the change in the monitored signal during the measurement process is maximised.

If the measurement were based on monitoring changes in the reflectance at a single characteristic wavelength of the upper layer or the underlying layer, even in the ideal case where there were no errors in the measurement process, the signal being measured would only show a decrease in reflectance at a characteristic peak of the upper layer of the sample (or, conversely, an increase in reflectance at a characteristic trough of the upper layer of the sample). Likewise, if a single characteristic wavelength of the underlying layer were measured, the signal being measured would only show an increase in reflectance at a characteristic peak of the lower layer of the sample (or, conversely, a decrease in reflectance at a characteristic trough of the lower layer of the sample).

However, if the ratio between the reflectance (or, indeed, the light intensity) at two characteristic wavelengths is used instead, the change in the reflectance at both wavelengths is taken into account. In the case of an AlGaN layer on a bulk GaN substrate, the reflectance measured in the 280 nm to 340 nm range will be falling while the reflectance measured at around 365 nm will be rising, and the swing in both of these measurements will be taken into account. In the case of an AlGaN layer on a bulk GaN substrate, it is convenient to use two wavelengths characteristic to the reflectance spectrum of the upper layer, but in other cases it may be convenient to use two wavelengths characteristic to the reflectance spectrum of the underlying layer, or one wavelength characteristic to the reflectance spectrum of the upper layer and one wavelength characteristic to the reflectance spectrum of the underlying layer.

A further benefit to monitoring two wavelengths is that it is not necessary for the two wavelengths to be precisely matched to the characteristic peaks or troughs of the upper and lower layers of the sample, as even if the swing in reflectance at one or both of the two wavelengths is reduced, the swing in the ratio between the two may still be large. For example, while the characteristic reflectance peak of an AlGaN layer is dependent on the aluminium content of that layer, any wavelength in the 280 nm to 340 nm range would give rise to a sufficient swing in the ratio. Therefore, a wavelength could be chosen somewhere in the middle of this range, say around 320 nm, that would allow for endpoint detection when etching AlGaN layers of a range of aluminium contents, so long as the target threshold ratio was adjusted accordingly for the specific AlGaN layer being etched.

Figure 3:
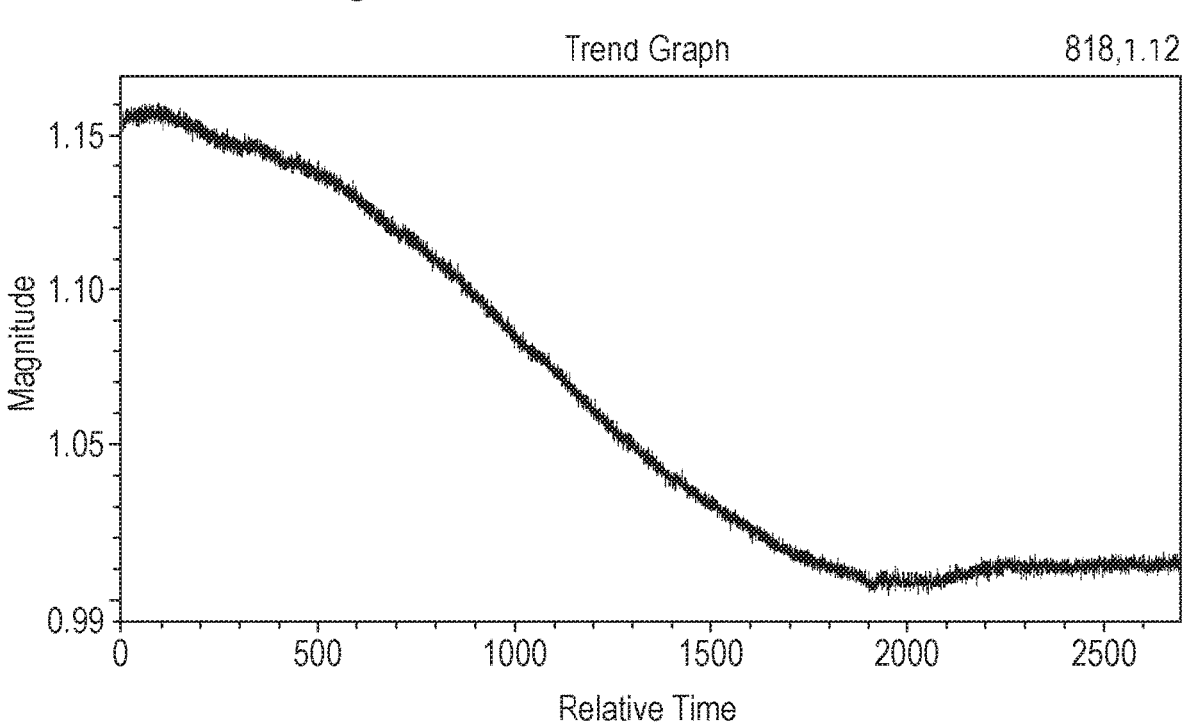
FIG. 3 shows the change in the 320 nm/365 nm reflectance ratio of a sample during an etch process provided according to embodiments of the invention.

FIG. 3 shows the change in the 320 nm to 365 nm reflectance ratio during an etch through 2 nm GaN/20 nm $Al_{20}GaN/2$ nm AlN down to the GaN substrate at an etch rate 2 nm/min, where $Al_{20}GaN$ has 20% Al content. As can be seen, after a brief increase as the 2 nm layer of GaN is removed, the ratio is predicted to decrease from a value of around 1.15 at the start of the etch to a value of around 1 when the AlGaN layer has been completely removed. By adjusting the endpoint based on a threshold in the value of this ratio, it is possible to etch to a desired target thickness.

Therefore, one way to determine an endpoint of an etch is to carry out a full etch of a sample to determine the relationship between values in the ratio of reflectance measurements at the two wavelengths and to then use this relationship to determine the endpoint in subsequent partial etches.

Another option is to compare the ratio of reflectance measurements at two wavelengths with a model of the expected change in this ratio.

Figure 4:
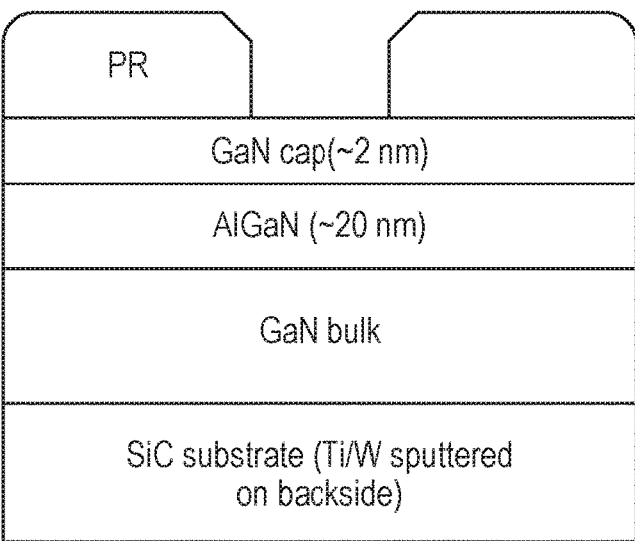
FIG. 4 shows an example of a device that may be etched in a process provided according to embodiments of the invention.

An example of a sample prior to an etch process is shown in FIG. 4. An SiC substrate has been Ti/W sputtered onto the underside/backside of bulk GaN. An approximately 20 nm thick layer of AlGaN is provided on top of the bulk GaN, with a further cap layer of GaN approximately 2 nm thick provided on the AlGaN layer. A patterned photoresist PR is provided on regions of the GaN cap and will act as a mask to the etch process.

Figure 5:
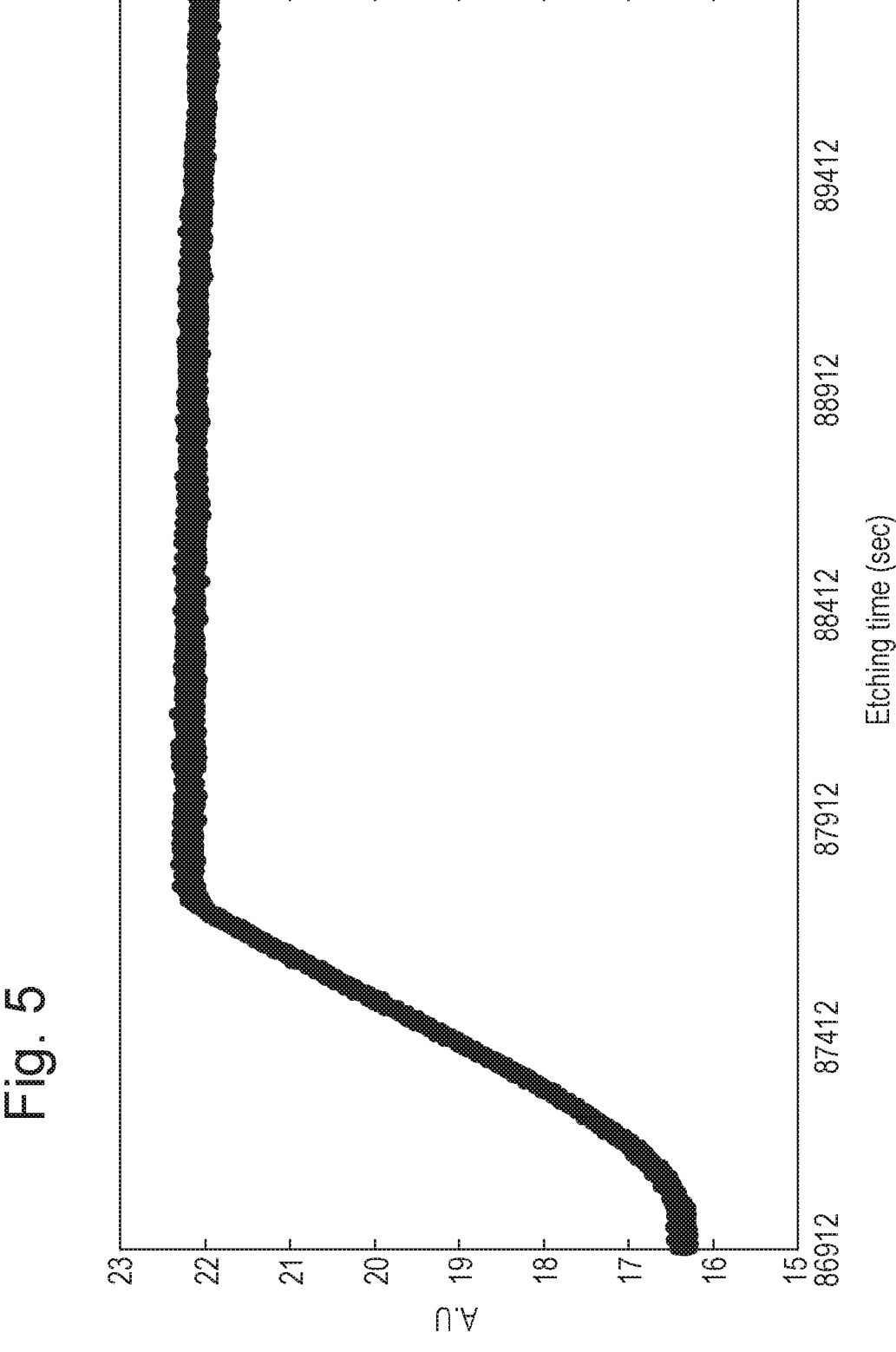
FIG. 5 shows the reflectance output from a reflectometer during a calibration process provided according to embodiments of the invention.

In order to calibrate the apparatus used to carry out the etch process, a calibration etch is performed on a sample as shown in FIG. 4 to detect the complete removal of the target layer, to give a reference result for subsequent partial etching. The etch then continues into the GaN bulk. The reflectance measurements at 365 nm throughout the etch is shown in FIG. 5. The delayed rise in the ratio at the start of the process indicates the removal of the GaN cap layer, after which there is a substantially linear rise in the ratio of reflectance measurements until this ratio reaches a plateau, also referred to as a knee. The knee indicates complete etching of the AlGaN layer. In this example the etch was continued into the underlying GaN layer, thereby confirming a plateau at around 22. (Arbitrary units, A.U., of reflected light intensity have been shown in FIG. 5.) A similar calibration etch can be carried out at a second wavelength.

Figure 6:
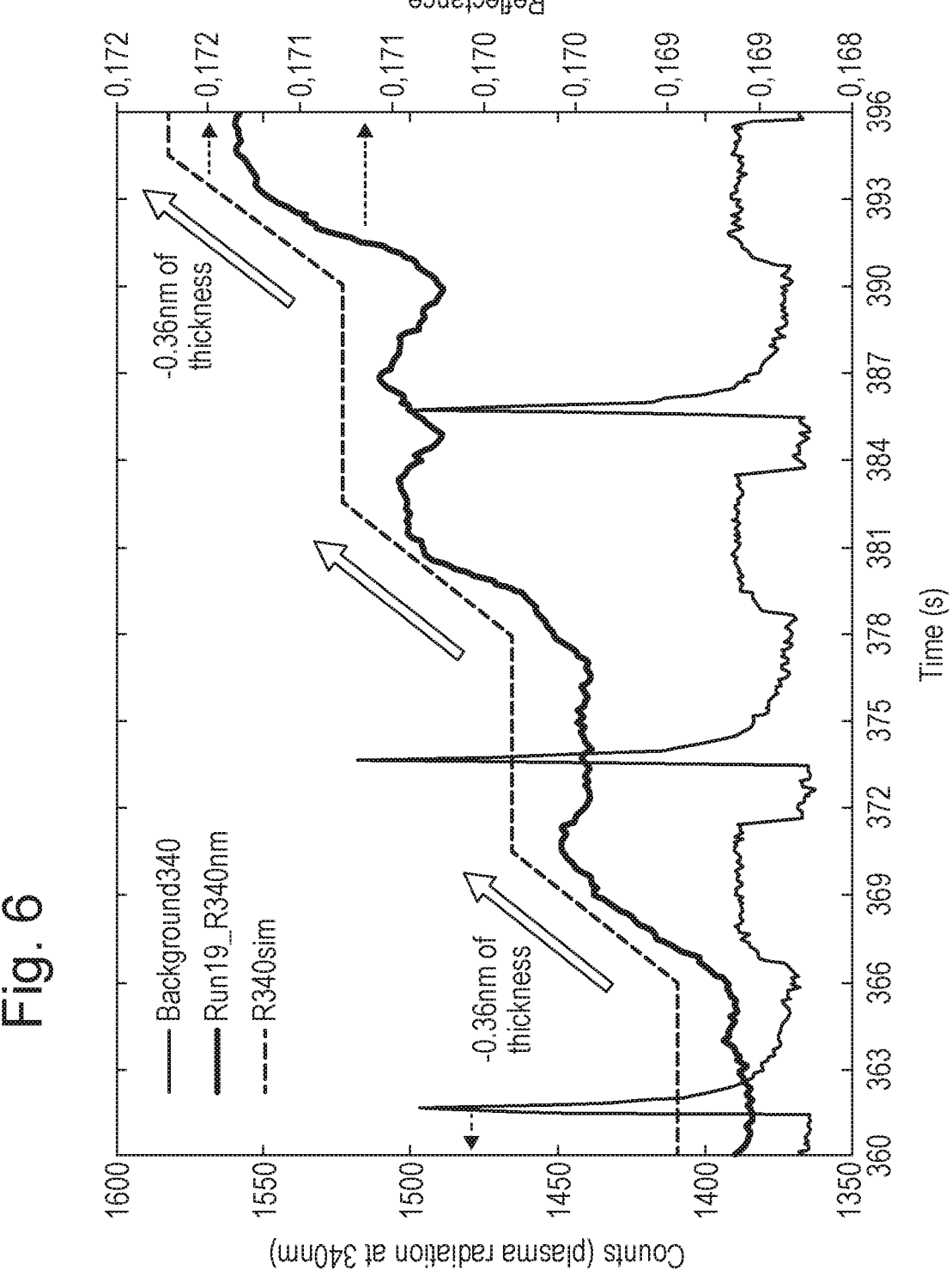
FIG. 6 shows the change in reflectance of a sample during an ALE process provided according to embodiments of the invention.

The present invention is particularly suitable for monitoring different stages of an ALE cycle, and FIG. 6 shows reflectance measurements taken at 340 nm compared with plasma radiation counts (from a spectrometer with a counting detector of intensity) at 340 nm during an ALE process. As can be seen, there are pronounced spikes in the radiation from the plasma at 340 nm, which coincide with brief pulses of chlorine gas flow. The plateaus in radiation from the plasma at around 1390 counts coincide with the addition of RF bias to the table, when the modified surface layer is removed. The middle solid line, which increases in stages from the left to the right of the graph, is the reflectance of the sample at 340 nm, showing a succession of steps in reflectance coinciding with layer removal. The dotted line is a simulation of layer thickness change, which can be determined by comparing the reflectance of the sample at 340 nm with the reflectance of the sample at 365 nm.

Figure 7:
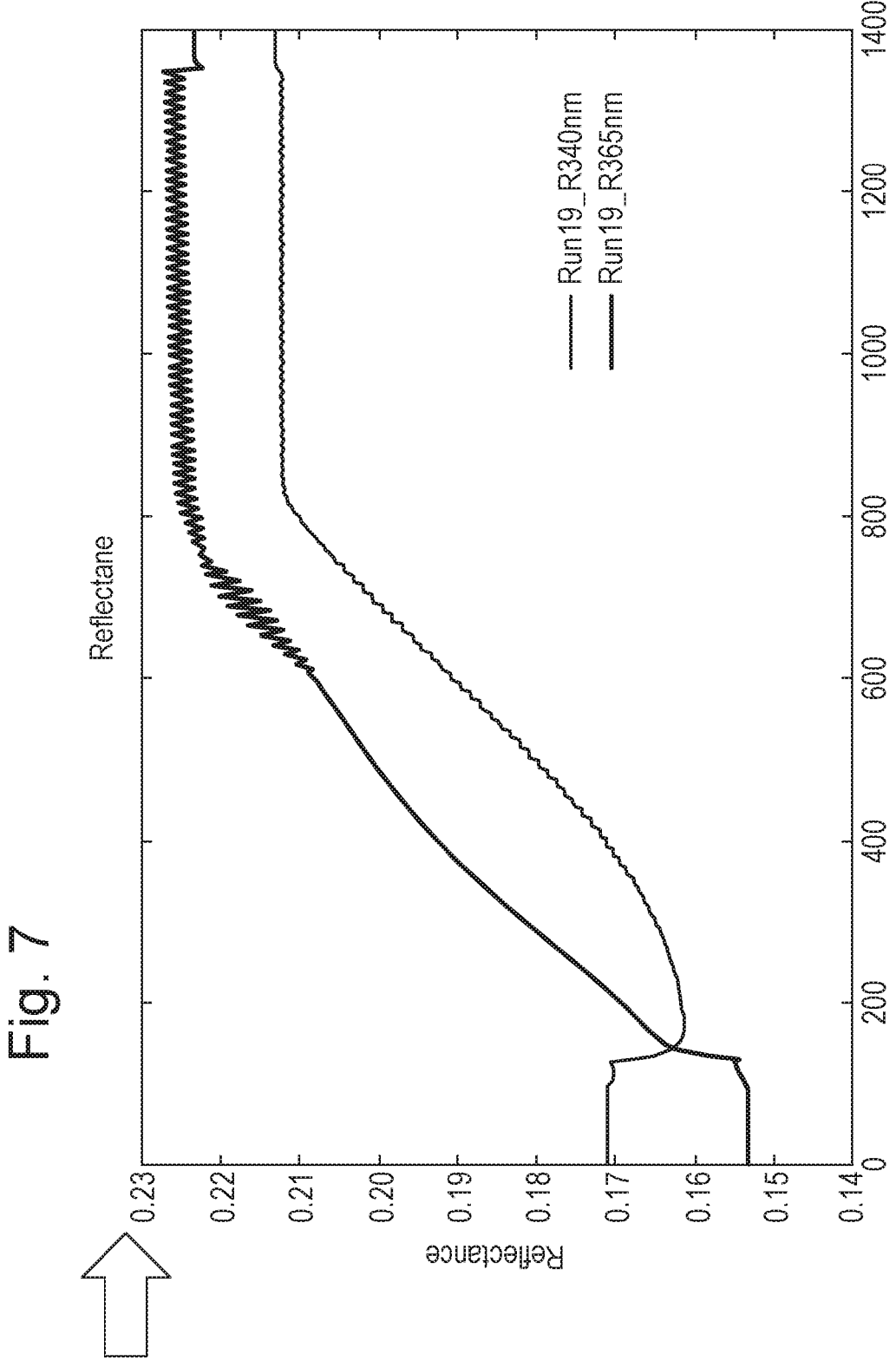
FIG. 7 shows the change in reflectance of a sample at two different wavelengths during an etch process provided according to embodiments of the invention.

Another way to monitor the change in thickness of the upper layer is to observe oscillations in reflectance at the interface, as shown in FIG. 7. This figure shows the reflectance at 340 nm and at 365 nm during another example of ALE of a sample as shown in FIG. 4. The small oscillations throughout the etch are due to the ALE cycle. Close to the interface between the AlGaN layer and the GaN bulk, the amplitude of oscillations at 365 nm become significantly larger, believed to be due to strain in the AlGaN layer. Monitoring the amplitude of these oscillations can be used to detect the approach of the interface, if the desired residual thickness lies within the range of this effect. In this case, the reflectance at 365 nm acts as a reference for the amplitude of the oscillations, which will be present for example in the ratio between these two reflectance measurements.

In the methods provided according to the present invention, the ratio in reflectance can be measured with a precision of approximately +/−0.001 and, as seen above, the ratio in reflectance can vary by about 20% during the complete etching of a 20 nm layer (varying between about 1.1 and 0.9 in FIG. 3a). This means the technique allows for a residual thickness of a target layer to be determined with a precision of +/−0.1 nm.

In order to minimise a trade-off between etch rate and stopping precision, it is advantageous if the etch rate is less than 0.1 nm in 3 seconds, or below 2 nm/minute, as it can take up to 3 seconds to produce a low noise reflectance ratio using time-integration smoothing. Generally, where a residual thickness precision of 0.1 nm is desired, the etch rate should preferably be below 0.1 nm in the noise-smoothing time, i.e. typically below 0.1 nm in 3 seconds. Increased precision can be obtained by adjusting the target endpoint for the predicted over-etch due to endpoint signal delay.

When etching a layer to a low residual thickness, by which we mean 10 nm or less, it is advantageous to use a high precision etching method such as ALE in combination with the endpoint detection described above. However, a disadvantage of ALE is that the rate of etching is slow compared to conventional etching processes such as inductively coupled plasma (ICP) etching. It is therefore advantageous to use a multi-stage etch process in which conventional etching is used in a first stage to etch a target layer to a first thickness followed by a second stage of ALE to etch the target layer to the desired residual thickness. This allows the etch process to be completed more quickly while still allowing a high precision in the residual thickness after the etch.

The invention claimed is:

1. A method of plasma etching or plasma deposition of a target layer of material in or onto a sample comprising a further layer of material, the method comprising:

during a process of plasma etching or plasma deposition of the target layer of material:

directing light of a first wavelength at the sample;

measuring the intensity of light of the first wavelength reflected by the sample;

directing light of a second wavelength at the sample; and measuring the intensity of light of the second wavelength reflected by the sample;

determining, based on the intensities of light reflected by the sample, an endpoint of the process of plasma etching or plasma deposition of the target layer of material;

ending the process of plasma etching or plasma deposition of the target layer of material based on the determined endpoint; and wherein determining the endpoint of the process of plasma etching or plasma deposition of the target layer of material comprises taking a ratio of the two measured intensities, wherein the first wavelength corresponds to a region of a reflectance spectrum of the target layer, or the further layer of material, without a peak or trough, such that the first wavelength provides a reference signal with which to compare the intensity of light reflected by the second wavelength; or wherein the second wavelength corresponds to a region of a reflectance spectrum of the target layer, or the further layer of material, without a peak or trough, such that the second wavelength provides a reference signal with which to compare the intensity of light reflected by the first wavelength.

2. A method according to claim 1, wherein the first wavelength is at a peak or trough in the reflectance of the target layer or of the further layer of material.

3. A method according to claim 2, wherein the first wavelength is in the range of 280 nm to 340 nm.

4. A method according to claim 1, wherein the second wavelength is at a peak or trough in the reflectance of the target layer or of the further layer of material.

5. A method according to claim 4, wherein the second wavelength is in the range of 340 nm to 390 nm.

6. A method according to claim 1, wherein determining the endpoint of the process of plasma etching or plasma deposition of the target layer of material comprises determining the reflectance of the sample at the first and second wavelengths.

7. A method according to claim 6, wherein determining the reflectance of the sample at the first and second wavelengths comprises, for each wavelength, taking the ratio of the intensity of light of said wavelength reflected by the sample to the intensity of light of said wavelength directed at the sample.

8. A method according to claim 6, wherein determining the endpoint of the process of plasma etching or plasma deposition of the target layer of material comprises taking a ratio of the determined reflectance of the sample at the first wavelength to the determined reflectance of the sample at the second wavelength.

9. A method according to claim 1, wherein one of the first and second wavelengths corresponds to a trough in an emission spectrum of a plasma used in the process of plasma etching or plasma deposition of the targe layer of material.

10. A method according to claim 1, wherein one or both of the light of the first wavelength and the light of the second wavelength directed at the sample are provided by a plasma used in the process of plasma etching or plasma deposition of the target layer of material.

11. A method according to claim 1, wherein the method comprises a calibration step of measuring the intensity of light of the first and second wavelengths reflected by the sample at the start of the process of plasma etching or plasma deposition of the target layer of material.

12. A method according to claim 1, wherein determining, based on the intensities of light reflected by the sample, an endpoint of a process of plasma etching the target layer of material comprises determining the thickness of the target layer of the sample at the start of the plasma etching process.

13. A method according to claim 1, wherein the endpoint is used to end the process of plasma etching or plasma deposition of the target layer of material at a predetermined residual thickness.

14. A method according to claim 13, wherein the predetermined residual thickness is 10 nm or less.

15. A method etching a target layer of material to a predetermined residual thickness according to claim 13, wherein, prior to the process of etching the target layer of material, the method comprises an earlier step of etching the target layer of material to a first residual thickness.

16. A plasma processing apparatus configured to perform the steps of claim 1, the apparatus comprising:

a plasma processing chamber;

at least two optical emitters;

at least two optical detectors; and at least one optical port for coupling the at least two optical emitters and the at least two optical detectors to the inside of the plasma processing chamber.

* * * * *